United States Patent
Beckman et al.

(10) Patent No.: US 7,043,711 B2
(45) Date of Patent: May 9, 2006

(54) SYSTEM AND METHOD FOR DEFINING SEMICONDUCTOR DEVICE LAYOUT PARAMETERS

(75) Inventors: John Charles Beckman, Minneapolis, MN (US); Gregory Allen Michaelson, Richfield, MN (US); Joel Frederick Kluender, Shakopee, MN (US)

(73) Assignee: Polar Semiconductor, Inc., Bloomington, MN (US)

( * ) Notice: Subject to any disclaimer, the term of this patent is extended or adjusted under 35 U.S.C. 154(b) by 0 days.

(21) Appl. No.: 10/183,911

(22) Filed: Jun. 26, 2002

(65) Prior Publication Data

US 2004/0003364 A1    Jan. 1, 2004

(51) Int. Cl.
*G06F 17/50* (2006.01)

(52) U.S. Cl. ................... 716/11; 716/2; 716/7
(58) Field of Classification Search ............ 716/2, 716/59, 10, 14, 11, 19, 1, 20, 21, 6, 17, 7
See application file for complete search history.

(56) References Cited

U.S. PATENT DOCUMENTS 5,717,928 A * 2/1998 Campmas et al. ............ 717/17
6,209,123 B1 * 3/2001 Maziasz et al. ............ 716/14
6,286,126 B1 * 9/2001 Raghavan et al. ............ 716/6
6,480,995 B1 * 11/2002 Schmidt et al. ............ 716/11
2002/0166107 A1 * 11/2002 Capodieci et al. ............ 716/19
2003/0229875 A1 * 12/2003 Smith et al. ............ 716/10

OTHER PUBLICATIONS

"Optical Proximity Correction", web page.
Geiger, Randall L., *VLSI Design Techniques for Analog and Digital Circuits*, pp. 56-59.
"Mosis Layer Map for TSMC35_SIL_and TSMC35_P2" web page.
"MOSIS Scalable CMOS (SCMOS) Design Rules (Revision 8.0)" web page.

\* cited by examiner

*Primary Examiner*—Thuan Do
(74) *Attorney, Agent, or Firm*—Kinney&Lange, PA

(57) ABSTRACT

A method to create a layout of a semiconductor device for the purpose of fabricating the semiconductor device is disclosed. The method allows a customer to create a partial layout of the semiconductor device based on a first set of rules, and then allows a manufacturer to generate a more complete layout of the semiconductor device based on the partial layout and the second set of rules.

11 Claims, 4 Drawing Sheets

SYSTEM AND METHOD FOR DEFINING SEMICONDUCTOR DEVICE LAYOUT PARAMETERS

BACKGROUND OF THE INVENTION

The present invention relates to a system and method for defining semiconductor device layout parameters, and more particularly to a system for generating layers of semiconductor devices from a reduced set of specified layout parameters and layers by automatically determining the remaining non-specified layout parameters and layers.

Semiconductor circuits or "chips" have become widely used in nearly all machines and products that have electronic components. A typical electronic circuit design is initially conceived and tested schematically by a circuit design engineer, with a number of components and devices connected together to yield a circuit with desired performance characteristics. Once the circuit has been designed, it must be reconfigured from schematic form into a layout form. This is typically a job for a physical design engineer, working in concert with the circuit design engineer to create a graphic layout specifying a suitable semiconductor implementation of the circuit. The graphic layout of the device, which specifies all of the semiconductor device layout parameters, is then submitted to a foundry for fabrication of the chip.

Laying out an electronic circuit in a semiconductor implementation is a complicated task, and is governed by a large number of geometric rules. A layout of a semiconductor device contains geometric features such as polygons to indicate proper size, shape, location and separation of a certain circuit physical feature (a sub-component within a semiconductor device) from other physical features or to indicate proper isolation and separation among the circuit elements. Furthermore, the layout of a typical semiconductor device contains multiple drawing layers, each layer having one or more polygons. Generally, the more complicated the device is, the more layers and polygons the layout includes. Conventionally, the laying out of drawing layers and polygons contained therein, is done by the product company (the customer) even though most of the rules for layout are determined by the manufacturer. Verification of the layout, communication among the parties, and revision and updating of the rules make the complicated layout process even more complicated. It is therefore usually a very labor intensive project for a physical design engineer, and a single mistake in laying out any of the polygons of the device can render the entire chip inoperative. In a typical situation where a product company is a customer of a foundry, for example, device and process engineers of the foundry determine a set of layout rules while the circuit design and physical design engineers of the product company create the layout for a particular device based on the rules. The complete set of rules suitable for the device must be communicated to the engineers of the product company (the customer) by the foundry (manufacturer) and the layout done by the product company must be carefully checked by someone at the foundry to ensure that all rules have been correctly followed. In such a situation, not only is the use of the complete set of rules itself burdensome on the physical design engineers of the product company, communication and logistics involving two different companies or offices also add an extra layer of complexity.

It would therefore be an improvement in the art to provide a system for laying out semiconductor circuits that reduces the complexity for physical design engineers in creating layouts that will be submitted to a foundry for fabrication. Such a system is the subject of the present invention.

BRIEF SUMMARY OF THE INVENTION

The present invention is a method by which a customer and a manufacturer may work together to create a layout of a semiconductor device. First and second sets of rules are defined. A partial layout of the semiconductor device is laid out according to the first set of rules. A more complete layout of the semiconductor device is then laid out based on the partial layout and the second set of rules. In one embodiment, the second set of rules are embodied in an automatic program, such as a computer program, to allow automatic generation of the more complete layout. The method simplifies the process of laying out semiconductor devices and reduces the workload of both the customer and the manufacturer by bifurcating the layout rules and allowing the manufacturer to fill in the part of layout that is not necessarily unique to the performance characteristics desired by a particular customer. This improves productivity and minimizes the chances for error in the layout. The reduction of the workload, improvement of productivity, and reduction in the chances for error can be further enhanced by automation of the part filled in by the manufacturer.

DETAILED DESCRIPTION

Figure 1:
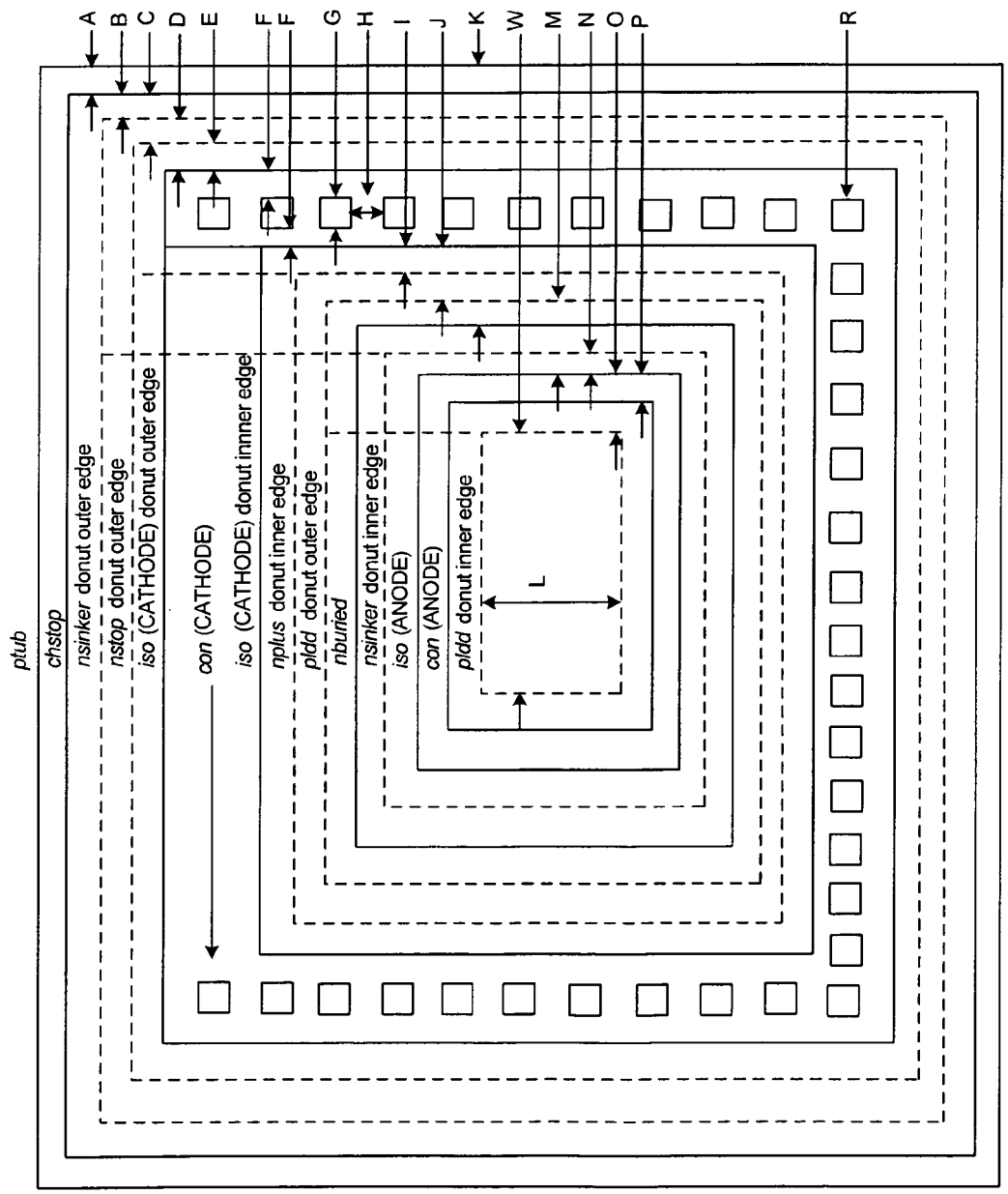
FIG. 1 is a diagram illustrating the layout of a Schottky diode according to an exemplary prior art semiconductor layout method.

According to the semiconductor layout method of the present invention, two sets of rules, which are capable of generating a complete layout for a given semiconductor device when applied together, are defined. The first set of rules are given to a customer (e.g., a product company), who schematically designs the semiconductor device as its own product. The customer creates a partial layout of the semiconductor device based on the first set of rules within the parameters preferred by the customer. The customer then submits the partial layout to the manufacturer. Upon receiving the partial layout from the customer, the manufacturer applies the second set of rules to the partial layout to generate a complete layout of the semiconductor device. The complete layout is then used by the manufacturer to create masks for fabricating the semiconductor device.

The inventors of the present invention realized that for a given type of device, the rules can be bifurcated into two separate sets: a first set that must be obeyed when creating a partial layout of the device by incorporating the customizable parameters selected by the customer (i.e., the design engineers of the product company), and a second set that completes the layout of the device based upon the partial layout created according to the first set of rules. The inventors of the present invention further realized that by carefully forming and organizing the rules, the first set of rules can be followed by a customer to create a suitable partial layout reflecting parameters selected by that particular customer, essentially without the customer's possession of any knowledge of the second set of rules. The second set of rules may then be applied to generate a complete layout without involvement by the customer. To this end, the first set of rules preferably involve parameters that can be customized by the customer to reflect its own design of the semiconductor device, and the second set of rules preferably involve parameters that are characteristic of the type of the semiconductor device and can essentially be determined by manufacturer without limiting the designing freedom of the customer. Bifurcating the rules therefore results in several advantages. First, a part of the rules (the second set of rules) become essentially "transparent" to the customer who sees the process progressing from a partial layout to a complete layout without having to have any knowledge of that part of the rules. This significantly lightens the burden on the customer to create a complete layout for his product. Second, the second set of rules are applied by and fully under control of the manufacturer. This eliminates the burden on the manufacturer to communicate these rules to the customer and to further check and ensure the result of the customer's execution of these rules. An additional benefit of the manufacturer having control over the second set of rules is that a typical manufacturer, such as a foundry, has multiple clients who may submit the same type of semiconductor devices, the manufacturer may standardize the execution of the second set of rules and apply them repeatedly. This results in the more efficient and less error prone procedure. The manufacturer may further make the execution automatic by implementing a computer program that embodies the second set of rules.

According to another aspect of the present invention, because the manufacturer may have multiple clients and each client may further have more than one type of device that needs to be made by the manufacturer, it is preferable that the partial layout contains information that helps the manufacturer uniquely identify the type of semiconductor device the layout is used for and thereby selected a suitable second set of rules to complete the layout. Such information for identification may simply be a label, a symbol, or a note marked on the partial layout, but more preferably is a standard identification layer that uniquely identifies the type of device being laid out, or at least certain characteristics of the device being laid out.

Bifurcating the rules may simply be regrouping existing conventional rules, but more preferably involves modifying the rules based on the existing rules or creating an entirely new set of rules to optimize them for the purpose of bifurcation. For example, the first set of rules should preferably be operable independently from the second set of rules and allow maximum freedom for the customer to implement the design parameters, with the second set of rules being derivative rules that are operable only based on an output (i.e., a partial layout) of the first set of rules.

The term "bifurcating" or "bifurcation" is used herein for the purpose of description only and does not suggest that the method of the present invention is limited to having two sets of rules only. If necessary, more than two sets of rules may be used to create a complete layout for a device. For example, in a situation where multiple stages of designing or multiple parties (such as groups or offices) are involved, a set of rules may be used at each stage and/or by each party.

Similarly, the term "complete layout" is used in a relative sense and does not suggest that once the second set of rules are applied, the resulting layout must always be entirely complete for the purpose of fabricating the underlying device about any further modification. For example, in a situation involving multiple stages or multiple parties, the present invention may be practiced either by all parties at all stages to create a truly complete layout or by any partial selection of the parties at responding related, preferably consecutive, stages, to create a layout that is only relatively more complete than the initial partial layout but may still be further modified.

The method of the present invention, using multiple sets of rules to lay out a semiconductor device, is further described with reference to a Schottky diode as an example of a semiconductor device that can be laid out according to the present invention. The layout method of the prior art (using a single set of rules) is first described, followed by the layout method of an exemplary embodiment of the present invention (using a first set of rules for the customer to define parameters of the device and a second set of rules that automatically generate the remaining parameters of the device). It should be understood by those skilled in the art that the method of the present invention can be used to create a layout of virtually any type of semiconductor device, including without limitation BJTs (e.g., NPNs, LPNPs, VPNPs, HBJTs), diodes (e.g., Schottky diodes, pn junction diodes, pin diodes), resistors (e.g., polysilicon resistors, thin film resistors, diffused resistors), inductors, capacitors (e.g., pn junction capacitors, dielectric capacitors, varactors), MOSFETs (e.g., NMOS, PMOS, lateral DMOS, vertical DMOS, semi-vertical DMOS), JFETs, MESFETs, HEMTs, IGBTs, memory (e.g., fuses, EPROMs, EEPROMs, flash memory, DRAMs, SRAMs), optical devices (e.g., photodiodes, CCDs, lasers), thyristors, guard rings, MEMs (e.g., gears, cantilevers, pumps), contacts (e.g., tub contacts, substrate contacts) and ESD devices.

FIG. 1 is a diagram illustrating the layout of a Schottky diode according to an exemplary prior art semiconductor layout method. The layout shown in FIG. 1 includes 35 cathode contacts and 11 other polygons, including 4 donut-shaped polygons, which must all be explicitly defined by a product engineer in order for the Schottky diode device to be properly fabricated. The relative locations and configurations of polygons are governed by 21 layout rules, as set forth in Table 1:

TABLE 1

| LABEL | VALUE (μm) | RULE |
|---|---|---|
| A | 0.50 | Minimum ptub surround chstop |
| B | 0.90 | Minimum chstop surround nsinker donut outer edge |
| C | 0.90 | Minimum chstop surround nplus donut outer edge |
| D | 0.40 | Minimum nsinker donut outer edge surround iso (CATHODE) donut outer edge |
| E | 0.40 | Minimum nplus donut outer edge surround iso (CATHODE) donut outer edge |
| F | 0.20 | Minimum iso (CATHODE) surround con (CATHODE). Note that this applies to both the outer and inner edges of the iso (CATHODE) donut. |
| G | 0.40 | Exact con (CATHODE) width |
| H | 0.50 | Minimum con (CATHODE) space |
| I | 0.30 | Minimum nplus donut inner edge surround iso (CATHODE) donut inner edge |
| J | 0.30 | Minimum pldd donut outer edge space from iso (CATHODE) donut inner edge |
| K | 2.95 | Exact ptub surround nburied |

TABLE 1-continued

| LABEL | VALUE (μm) | RULE |
|---|---|---|
| L | 4.40 | Exact space of pldd donut inner edge in the vertical direction of FIG. 1 (Schottky diode "length") |
| M | 0.40 | Minimum pldd donut outer edge surround iso (ANODE) |
| N | 0.30 | Exact nsinker donut inner edge surround iso (ANODE) |
| O | 1.60 | Exact iso (ANODE) surround pldd donut inner edge |
| P | 1.20 | Exact iso (ANODE) surround con (ANODE) |
| Q | 0.15 | Minimum met1 surround con (CATHODE) (not shown) |
| R | N/A | A minimum of 35 con (CATHODE) features must be present |
| S | 1.10 | Minimum met1 surround con (ANODE) (not shown) |
| W | 7.20 | Minimum space of pldd donut inner edge in the horizontal direction of FIG. 1 (Schottky diode "width") |
| W | 30.00 | Maximum space of pldd donut inner edge in the horizontal direction of FIG. 1 (Schottky diode "width") |

The dimensions referred to in Table 1 are shown in FIG. 1 to clarify their definitions, with the exception of rules Q and S which do not lend themselves to being shown in the drawing. In the layout definition terminology, "width" refers to the distance between two parallel edges of the same feature that have no gaps between them. The rules set forth in Table 1 include a description of the direction shown in FIG. 1 (horizontal or vertical) and whether that direction is the "length" or "width" direction of the Schottky diode, to more clearly indicate the direction in which a particular width is measured. "Space" is the radial distance between any two points, including the exterior distance between two points in the same polygon. Space usually implies that there is no overlap between the two referenced polygons. "Surround" is the distance between two polygons, where the smaller of the polygons lies entirely inside the larger polygon. "Donut" refers to a pattern in which a polygon wraps completely around an empty inner region, and thus has an outer edge and an inner edge. Each of the semiconductor mask layers of the Schottky diode are identified in italics.

Figure 2:
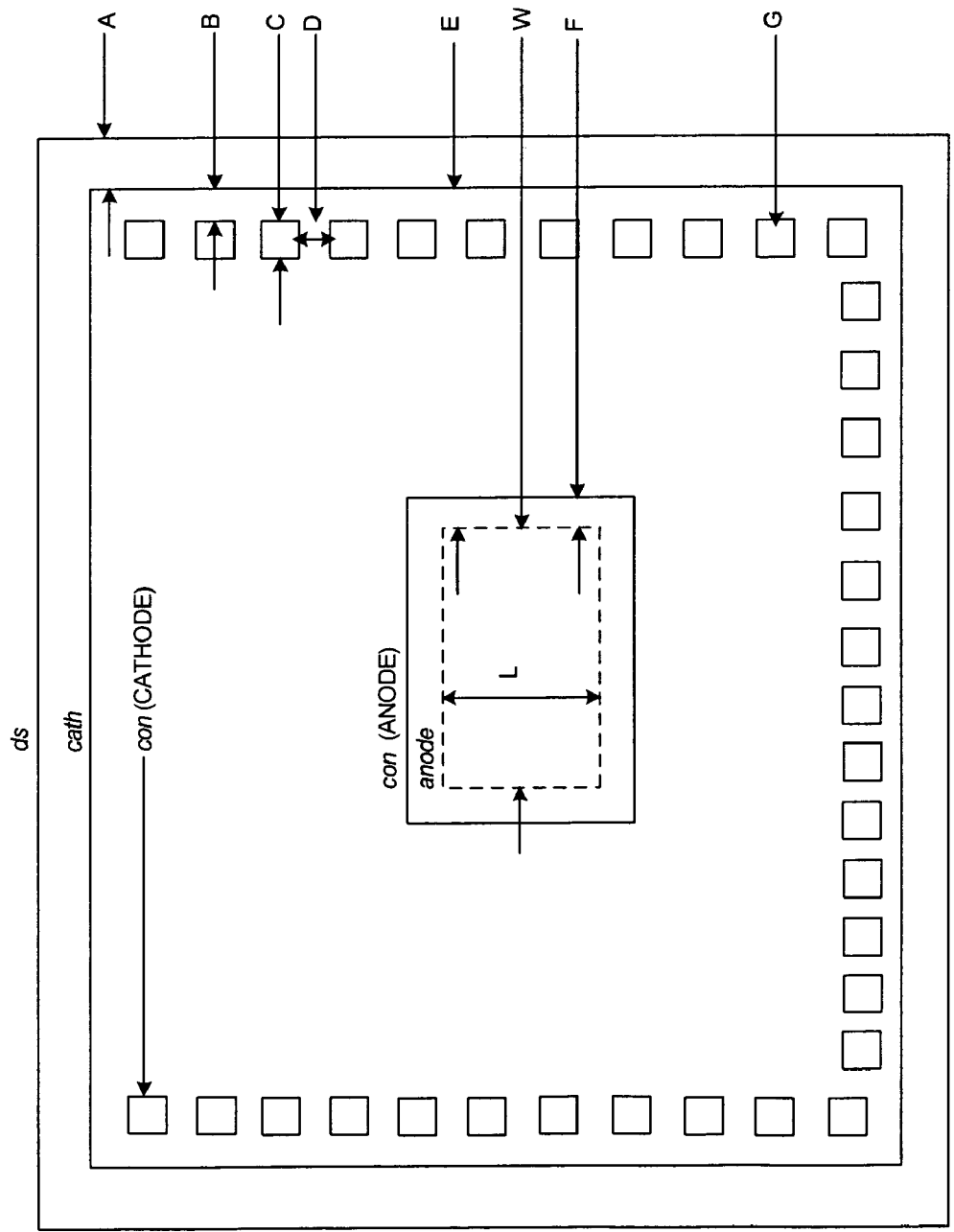
FIG. 2 is a diagram illustrating a partial layout of a Schottky diode according to the semiconductor layout method of the present invention.

FIG. 2 is a diagram illustrating a partial layout of a Schottky diode according to the semiconductor layout method of the present invention. The partial layout shown in FIG. 2 includes 35 cathode contacts, 6 other polygons, and no donut-shaped polygons. The relative locations and configurations of polygons are governed by a first set of 12 layout rules, as set forth in Table 2:

TABLE 2

| LABEL | VALUE (μm) | RULE |
|---|---|---|
| A | 1.80 | Minimum ds surround cath |
| B | 0.20 | Exact cath surround con (CATHODE) |
| C | 0.40 | Exact con (CATHODE) width |
| D | 0.50 | Minimum con (CATHODE) space |
| E | 3.10 | Exact cath surround anode |
| F | 0.40 | Exact con (ANODE) surround anode |
| G | N/A | A minimum of 35 standard contacts must be included in each cath |
| H | 1.10 | Minimum met1 surround con (ANODE) (not shown) |
| I | 0.15 | Minimum met1 surround con (CATHODE) (not shown) |
| L | 4.40 | Exact anode width in the vertical direction of FIG. 2 (Schottky diode "length") |
| W | 7.20 | Minimum anode width in the horizontal direction of FIG. 2 (Schottky diode "width") |
| W | 30.00 | Maximum anode width in the horizontal direction of FIG. 2 (Schottky diode "width") |

Figure 3:
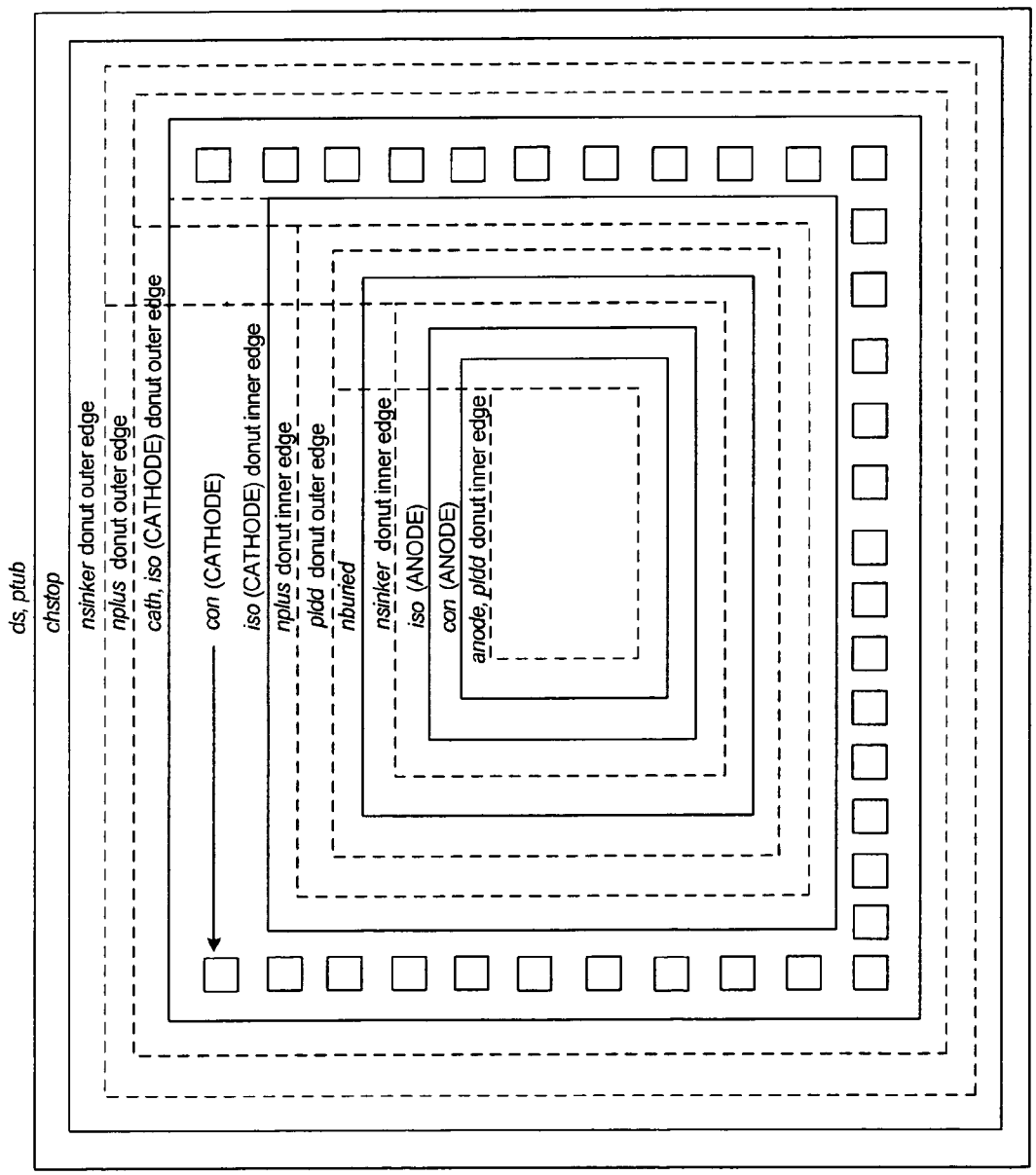
FIG. 3 is a diagram illustrating a complete layout of a Schottky diode according to the semiconductor layout method of the present invention.

The partial layout (FIG. 2) has a unique identification layer "ds" to identify the Schottky diode. After the partial layout (FIG. 2) has been created (typically by a customer), a complete layout (FIG. 3) is generated by adding additional layers using the following second set of rules, as set forth in Table 3:

TABLE 3

| | |
|---|---|
| nplus | ds AND ((cath + 0.4) EXCLUDE (anode + 2.0)) |
| pldd | ds AND ((anode + 2.0) EXCLUDE anode) |
| iso | ds AND ((anode + 1.6) OR (cath EXCLUDE (cath − 0.8))) |
| nsinker | ds AND ((cath + 0.4) EXCLUDE (anode + 1.9)) |
| nburied | ds − 2.95 |
| chstop | ds − 0.5 |
| ptub | ds − |

The sizing function "+" increases the size of the polygon by a specified amount on each side for the purpose of calculating the size of the polygon to be generated. Similarly, the sizing function "−" decreases the size of the polygon by a specified amount on each side. The function EXCLUDE performs a Boolean "AND NOT" and the function OR performs a Boolean "OR."

This second set of rules defines layers of the Schottky diode that affect its performance parameters only in ways that are completely specified by the first set of layers and the first set of rules. The customer therefore does not need to have any particular knowledge of these rules and layers, and can uniquely define the performance characteristics of the device by laying out layers according to the first set of rules only.

Figure 4:
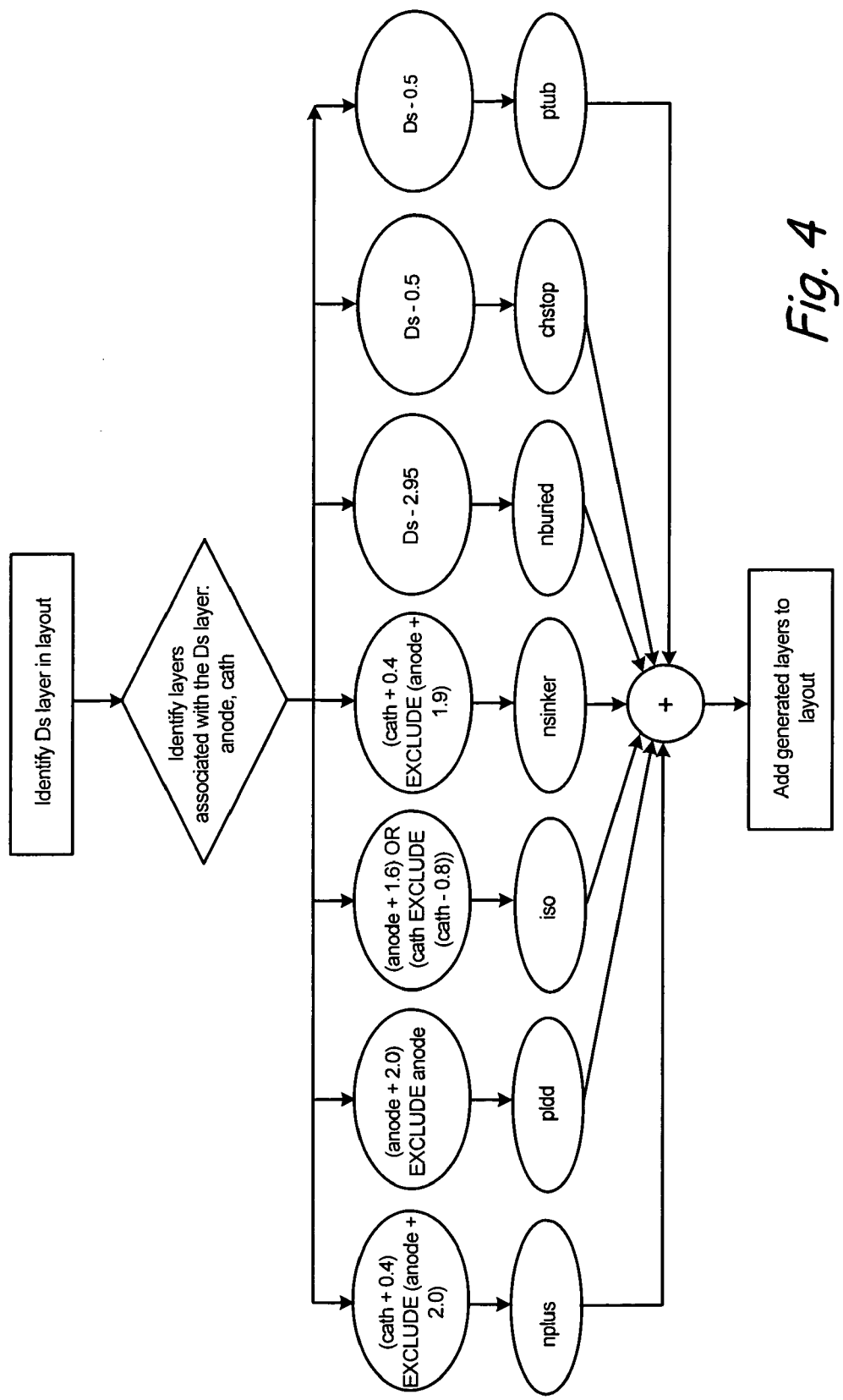
FIG. 4 is a block diagram illustrating of the generation of the complete Schottky diode layout based on a partial layout in accordance with the method of the present invention.

FIG. 4 is a block diagram illustrating the generation of the complete Schottky diode layout based on a partial layout in accordance with method of the present invention. First, the identification layer "ds" for Schottky diode is identified in the partial layout. Other layers such as anode and cath in the partial layout are further identified, according to a first set of layout rules followed by the customer. In the next step, a proper second set of rules are selected based on the identification. These rules, as set forth in Table 3, are then used to generate additional layers nplus, pldd, iso, nsinker, nburied, chstop, and ptub. Finally, the additional layers are added to the partial layout to generate the complete layout (FIG. 3) for the Schottky diode. In an exemplary embodiment, the second set of rules are automatically applied by a suitable computer software program.

The complete layout (FIG. 3) of a Schottky diode according to the semiconductor layout method of the present invention is identical to the layout of the Schottky diode according to the exemplary prior art semiconductor layout method in FIG. 1, except for the addition of the ds, anode and cath layers, which were needed to achieve the complete layout. Because the generation of the additional layers (nplus, pldd, iso, nsinker, nburied, chstop and ptub) may be done by a manufacturer, the customer has fewer layers to draw and fewer rules to follow in order to create the partial layout (FIG. 2) as compared to the layout required of the customer according to conventional methods (FIG. 1).

Although the present invention has been described with reference to preferred embodiments, workers skilled in the art will recognize that changes may be made in form and detail without departing from the spirit and scope of the invention.

The invention claimed is:

1. A method for generating a complete layout of a semiconductor device for the purpose of fabricating the semiconductor device, the method comprising:

creating a first layout of the semiconductor device, the first layout comprising a first set of geometric features, being based on a first set of rules and defining all performance parameters of the semiconductor device; and generating the complete layout of the semiconductor device based on the first layout and a second set of rules, the complete layout comprising the first set of geometric features and an additional second set of geometric features, wherein the second set of rules are selected based on the first set of rules used to create the first layout and do not affect the performance parameters defined by the first layout.

2. The method of claim 1, wherein the first layout contains an identifier that uniquely identifies a type of the semiconductor device, the method further comprising:

selecting the second set of rules based on the identifier.

3. The method of claim 1, wherein the first layout is created by a first party and the complete layout is generated by a second party.

4. The method of claim 3, wherein the first party is a customer and the second party is a manufacturer.

5. The method of claim 1, wherein the first set of rules specifies all features of the device that are allowed options for a customer and the second set of rules adds features that are required to manufacture the device as specified by the customer and therefore have no allowed options for the customer.

6. The method of claim 1, wherein the complete layout is generated separate from the first layout and the second set of rules are applied using an automatic program to generate the complete layout.

7. The method of claim 1, wherein the semiconductor device is selected from the group consisting of BJTs, diodes, resistors, inductors, capacitors, MOSFETs, JFETs, MESFETs, HEMTs, IGBTs, memories, optical devices, thyristors, guard rings, MEMs and ESD devices.

8. A method for generating a layout of a semiconductor device for the purpose of fabricating the semiconductor device, the method comprising:

defining a first set of rules which allows for all performance parameters of the semiconductor device to be selected;

defining at least a second set of rules which do not affect any of the performance parameters of the semiconductor device;

creating a partial layout of the semiconductor device based on the first set of rules and reflecting the performance parameters selected within the framework of the first set of rules the partial layout comprising a first set of geometric features; and generating a more complete layout of the semiconductor device based on the partial layout and the second set of rules, the more complete layout comprising the first set of geometric features and an additional second set of geometric features, wherein the second set of rules are applied automatically and do not affect the performance parameters selected in creating the partial layout.

9. The method of claim 8, wherein the second set of rules are automatically applied using computer software to generate the more complete layout.

10. The method of claim 8, wherein the partial layout contains identification information that uniquely identifies a type of the semiconductor device, the method further comprising:

selecting the second set of rules based on the identification of the type of the semiconductor device.

11. The method of claim 8, wherein the semiconductor device is selected from the group consisting of BJTs, diodes, resistors, inductors, capacitors, MOSFETs, JFETs, MESFETs, HEMTs, IGBTs, memories, optical devices, thyristors, guard rings, MEMs and ESD devices.

* * * * *

UNITED STATES PATENT AND TRADEMARK OFFICE
CERTIFICATE OF CORRECTION

| | | |
|---|---|---|
| PATENT NO. | : 7,043,711 B2 | Page 1 of 1 |
| APPLICATION NO. | : 10/183911 | |
| DATED | : May 9, 2006 | |
| INVENTOR(S) | : John Charles Beckman et al. | |

It is certified that error appears in the above-identified patent and that said Letters Patent is hereby corrected as shown below:

Column 1 of Cover Page, first reference under References Cited,
delete "717/17", insert --716/17--

Signed and Sealed this

Nineteenth Day of December, 2006

JON W. DUDAS
*Director of the United States Patent and Trademark Office*